United States Patent
Sant et al.

(10) Patent No.: US 8,232,538 B2
(45) Date of Patent: Jul. 31, 2012

(54) METHOD AND APPARATUS OF HALOGEN REMOVAL USING OPTIMAL OZONE AND UV EXPOSURE

(75) Inventors: Sanket Sant, Fremont, CA (US); Shang-I Chou, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 177 days.

(21) Appl. No.: 12/606,528

(22) Filed: Oct. 27, 2009

(65) Prior Publication Data

US 2011/0095207 A1    Apr. 28, 2011

(51) Int. Cl.
*A61N 5/06* (2006.01)
*C23F 1/00* (2006.01)
*H01L 21/306* (2006.01)

(52) U.S. Cl. ............. 250/504 R; 250/459.1; 250/461.1; 250/492.1; 156/345.31; 156/345.5; 216/66

(58) Field of Classification Search ............... 250/458.1, 250/459.1, 461.1, 492.1, 504 R; 216/58, 216/60, 63, 65, 66; 156/345.31, 345.32, 156/345.5

See application file for complete search history.

(56) References Cited

U.S. PATENT DOCUMENTS

| | | | | |
|---|---|---|---|---|
| 5,217,559 A * | 6/1993 | Moslehi et al. | ......... | 156/345.35 |
| 5,981,399 A * | 11/1999 | Kawamura et al. | ............ | 438/715 |
| 6,232,248 B1 * | 5/2001 | Shinriki et al. | ............... | 438/785 |
| 6,661,075 B2 | 12/2003 | Varhue et al. | | |
| 6,734,120 B1 * | 5/2004 | Berry et al. | ............... | 438/715 |
| 6,848,455 B1 | 2/2005 | Shrinivasan et al. | | |
| 7,118,852 B2 * | 10/2006 | Purdum | ............... | 435/2 |
| 7,265,382 B2 * | 9/2007 | Lymberopoulos et al. | ..... | 257/48 |
| 7,396,480 B2 * | 7/2008 | Kao et al. | ............... | 216/58 |
| 7,514,015 B2 | 4/2009 | Elliott et al. | | |
| 7,843,632 B2 * | 11/2010 | Bowering | ............... | 359/359 |
| 2002/0114880 A1 * | 8/2002 | Dreistein et al. | ............... | 427/8 |
| 2002/0170671 A1 * | 11/2002 | Matsushita et al. | ...... | 156/345.31 |
| 2003/0070690 A1 | 4/2003 | Danese | | |
| 2003/0192577 A1 * | 10/2003 | Thakur et al. | ............... | 134/146 |
| 2004/0045578 A1 | 3/2004 | Jackson | | |
| 2004/0111339 A1 * | 6/2004 | Wehrung et al. | ............... | 705/30 |
| 2004/0154743 A1 * | 8/2004 | Savas et al. | ............... | 156/345.5 |

(Continued)

FOREIGN PATENT DOCUMENTS

EP    1 508 385 A1    2/2005

(Continued)

OTHER PUBLICATIONS

International Search Report dated Jun. 3, 2011 from International Application No. PCT/US2010/053858. Written Opinion dated Jun. 3, 2011 from International Application No. PCT/US2010/053858.

*Primary Examiner* — Bernard E Souw
(74) *Attorney, Agent, or Firm* — Beyer Law Group LLP (57) ABSTRACT

A method and apparatus for removing halogen residue from a processed wafer is provided. A wafer is transferred into a processing tool where it is processed in a manner that leaves halogen residue on the wafer. The processed wafer is then moved into a degas chamber where it is treated with UV light and a gas mixture containing at least one of ozone and oxygen to remove the halogen residue. Once treated, the wafer is transferred into an isolation station where it is isolated from the unprocessed wafers for a period of time to allow any remaining residue to dissipate before it is returned to the cassette where it started.

20 Claims, 6 Drawing Sheets

U.S. PATENT DOCUMENTS

| | | | |
|---|---|---|---|
| 2004/0238122 A1* | 12/2004 | Ishizawa et al. | 156/345.31 |
| 2005/0098264 A1 | 5/2005 | Wolf et al. | |
| 2005/0218481 A1* | 10/2005 | Lee et al. | 257/642 |
| 2005/0221606 A1* | 10/2005 | Lee et al. | 438/624 |
| 2005/0223989 A1* | 10/2005 | Lee et al. | 118/722 |
| 2007/0107845 A1* | 5/2007 | Ishizawa et al. | 156/345.32 |
| 2008/0230096 A1* | 9/2008 | Kawamura et al. | 134/90 |
| 2008/0254619 A1 | 10/2008 | Lin et al. | |
| 2011/0097902 A1* | 4/2011 | Singh et al. | 438/710 |

FOREIGN PATENT DOCUMENTS

| | | |
|---|---|---|
| JP | 61-39524 | 2/1986 |
| JP | 1-189122 | 7/1989 |
| JP | 1-272120 | 10/1989 |
| JP | 6-063379 | 3/1994 |
| JP | 7-66159 | 3/1995 |
| KR | 10-1999-0033654 | 5/1999 |

* cited by examiner

METHOD AND APPARATUS OF HALOGEN REMOVAL USING OPTIMAL OZONE AND UV EXPOSURE

BACKGROUND OF THE INVENTION

1. Field of the Invention

The invention relates to semiconductor devices. More specifically, the invention relates to the production of semiconductor devices which require processing wafers where halogens are used during the processing.

2. Description of the Related Art

During the formation of semiconductor devices, wafers are processed in a processing tool where they are subject to processes that may result in residual process gases, segments and byproducts being left on the surface of the wafers. These residues may include, but are not limited to halogen-containing species.

One method of removing the residue is by treating the processed wafers in a microwave stripper module. A microwave stripper module may be placed as one module in a processing tool. The processed wafer would then be placed in the microwave stripper module where the halides on the surface of the processed wafer would be removed/reduced. However, this stripping process occurs after processing within the vacuum of the processing tool. Thus the microwave stripper module takes up one of the valuable spots in the processing tool. Using this spot in the processing tool for the microwave stripper module means that the spot cannot be used for another process chamber which results in a decrease in wafer processing throughput.

SUMMARY OF THE INVENTION

To achieve the foregoing and in accordance with the purpose of the present invention, a degas load lock station for removing halogen species from a wafer that have accumulated during processing of the wafer and transferring the wafer from a vacuum chamber to atmosphere is provided. A degas chamber is provided that is capable of creating and maintaining a vacuum. There is a wafer holder for holding the wafer in the degas chamber. A pressure sensor is coupled with the degas chamber for sensing the pressure in the degas chamber. A UV light source provides UV light in the degas chamber. An injector is coupled with the degas chamber for injecting gas comprising at least one of oxygen or ozone into the degas chamber and is located in such a manner to provide a gas flow over the wafer housed in the degas chamber. An exhaust system is coupled with the degas chamber and capable of evacuating the degas chamber creating and maintaining a vacuum. There is an atmospheric vent capable of venting the degas chamber to atmospheric pressure to provide for the wafer transfer to atmosphere. There is a first wafer opening in the degas chamber for receiving the wafer from the vacuum chamber. There is a second wafer opening in the degas chamber for transferring the wafer to an ambient atmosphere environment. A plurality of vacuum seals surround the first wafer opening such that the degas chamber is coupled with the vacuum chamber at the first wafer opening, and the plurality of vacuum seals maintain a vacuum seal between the degas chamber and the vacuum chamber.

Another manifestation of the invention comprises a method for processing a wafer used to produce semiconductor devices in such a way as to substantially prevent contamination from halogen species residue. A wafer is provided into an entrance load lock chamber. A vacuum is created in the entrance load lock chamber. The wafer is transported from the entrance load lock chamber to a processing tool. The wafer is processed to provide a processed wafer, wherein the processing forms halogen residue on the wafer. The processed wafer is transferred into a degas chamber through a first opening in the degas chamber, wherein a vacuum is maintained in the degas chamber. The processed wafer is treated in the degas chamber with UV light and a flow of gas comprising at least one of ozone or oxygen. The flow of gas is stopped. The degas chamber is vented such that the vacuum is removed. The UV light is stopped. The processed wafer is removed from the degas chamber through a second opening in the degas chamber.

Another manifestation of the invention comprises a system for processing a wafer used to produce semiconductor devices. The system comprises an entrance load lock, a degas load lock station and a processing tool. The degas load lock station comprises a degas chamber capable of creating and maintaining a vacuum and capable of housing the wafer; a wafer holder in the degas chamber, for holding the wafer; a pressure sensor, coupled with the degas chamber, for sensing the pressure in the degas chamber; a UV light source that provides UV light in the degas chamber, for treating the wafer with UV light while the wafer is in the degas chamber; an injector, coupled with the degas chamber and located in such a manner that the injector flows gas over the wafer housed in the degas chamber; an exhaust system, coupled with the degas chamber, capable of evacuating the degas chamber to create and maintain a vacuum in the degas chamber; an atmospheric vent capable of venting the degas chamber to atmospheric pressure to provide for wafer transfer to atmosphere; a first wafer opening in the degas chamber; a second wafer opening in the degas chamber for transferring the wafer to an ambient atmosphere environment; and a plurality of vacuum seals surround the first wafer opening. The processing tool comprises a vacuum transport module, coupled with the entrance load lock and coupled with the degas chamber at the first wafer opening; and a plurality of processing chambers, coupled with the vacuum transport module. The plurality of vacuum seals surround the first wafer opening such that the degas chamber is coupled with the vacuum transport module and the plurality of vacuum seals maintain a vacuum seal between the degas chamber and the vacuum transport module.

These and other features of the present invention will be described in more details below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

When wafers are processed during the production of semiconductor devices, the wafers are often left with halogen residue as a result of the processing. When the wafers containing the residue are returned to atmosphere, the residues may react with the moisture in the atmosphere causing contamination. There are three main types of contamination that may be caused by the residue: 1) self contamination, 2) cross contamination and 3) equipment contamination.

Self contamination may result when the residue on the wafer reacts with the atmosphere and causes damage to the wafer itself. For example, condensation on the wafer can result in crystalline defects, mask erosion or pattern collapse.

Cross contamination may result when a wafer containing residue is placed in close proximity to other wafers, including unprocessed wafers. For example, this could occur when the processed wafer and unprocessed wafer are close as the processed wafer is being put in the load lock for return to the cassette in atmosphere and the unprocessed wafer is being removed from the load lock to be processed. An additional example is when the processed wafer is returned to a cassette containing many unprocessed wafers. During these times of close proximity, the residue from the processed wafers may migrate to the unprocessed wafers, thus contaminating the unprocessed wafers. This cross contamination may cause defects in the unprocessed wafers when they are subsequently processed. For example, the contamination may cause micromasking defects.

Equipment contamination may result when the wafer with residue reaches the atmosphere and the residue reacts with the moisture in the atmosphere. This reaction may cause acidic outgassing which may transfer to wafer handling equipment, for example the robotic arms used to transfer the wafers. The acidic nature of the contaminant may then cause corrosive damage over time.

A method of reducing or eliminating the contamination from the halogen residue is needed that does not decrease the wafer processing throughput and that does not require the high temperatures used in the microwave stripper module. Some wafers may be made of materials that cannot withstand the high temperatures used in the microwave stripper module, often 200° C. to 400° C. For example, wafers using amorphous carbon would simply burn up if subjected to the temperatures required in the microwave stripper.

Figure 1:
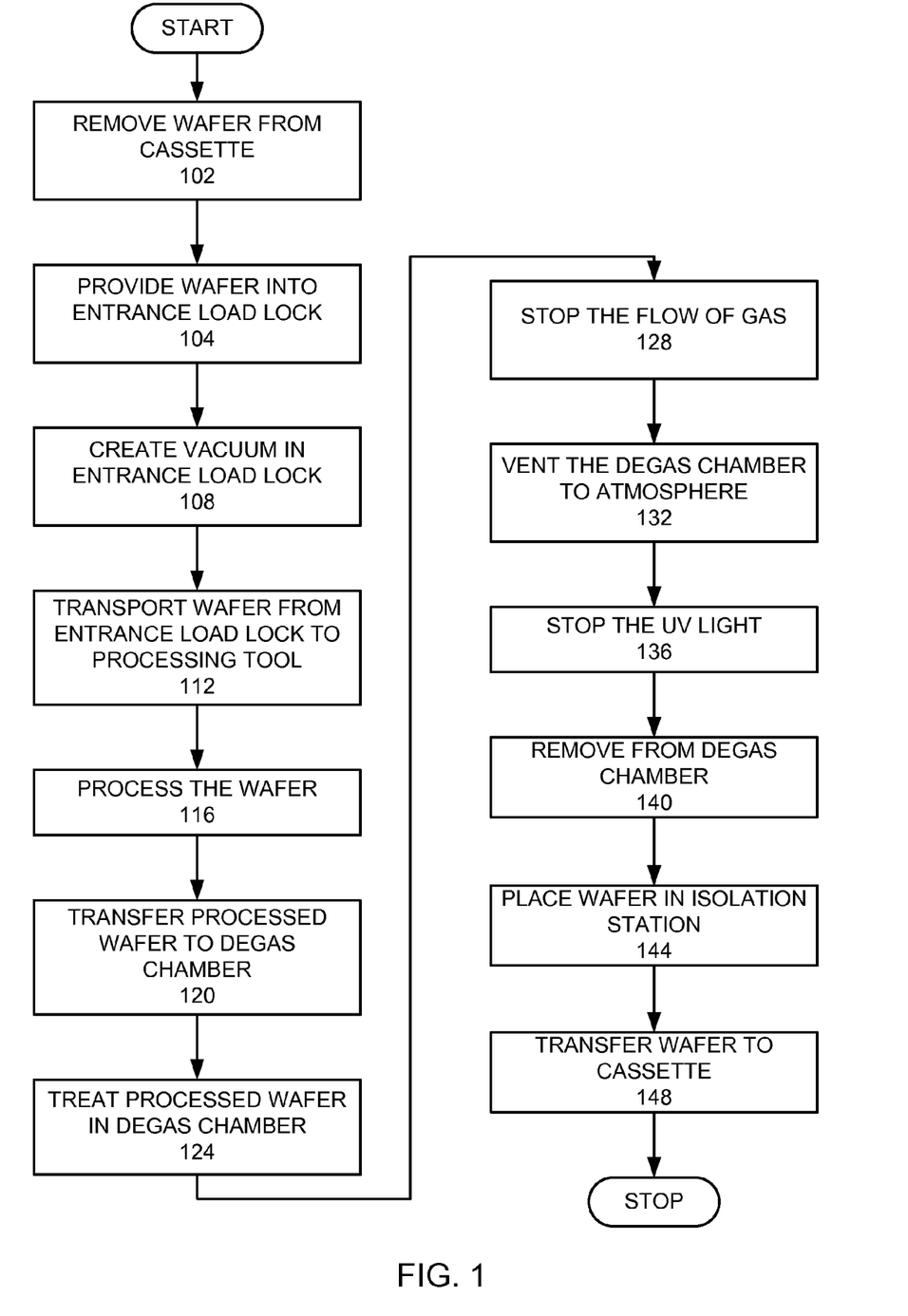
FIG. 1 is a flow chart of an embodiment of the invention.

FIG. 1 is a high level flow chart of an embodiment of the invention. An unprocessed wafer typically starts outside of the processing tool in normal atmosphere in a cassette that may hold a plurality of wafers. In order to be processed, it must be moved into the vacuum of the processing tool. In this embodiment, the wafer is removed from the cassette (step 102) and moved into an entrance load lock (step 104). The entrance load lock is closed and a vacuum is formed in the entrance load lock (step 108). Once the vacuum has been established in the entrance load lock, the door to the vacuum of the processing tool is opened and the wafer is transferred from the entrance load lock to a processing tool (step 112) where the wafer is processed (step 116). The processing may include having an etch mask applied, being etched or stripping an etch mask, for example. The processing may actually include multiple processes that may require the use of one or multiple processing chambers within the processing tool. The processed wafer is now transferred into the degas chamber (step 120). The degas chamber is then sealed and now contains a vacuum. The wafer is treated with UV light and a gas mixture to remove the halide residue (step 124). The gas mixture comprises at least one of ozone or oxygen. While the gas mixture is flowing over the processed wafer, it is also being pumped out of the degas chamber. After the prescribed treatment time, the flow of gas is stopped (step 128), the degas chamber is vented to atmosphere (step 132) and the UV light is stopped (step 136). Once the pressure in the degas chamber has equalized with the atmosphere outside the degas chamber, the treated wafer is removed from the degas chamber (step 140). The treated wafer may then be placed in the isolation station (step 144) for a period of time to allow any remaining residue to dissipate. The treated wafer may then be transferred to a cassette (step 148).

An embodiment of the degas load lock station includes a number of components described in detail below.

Figure 2:
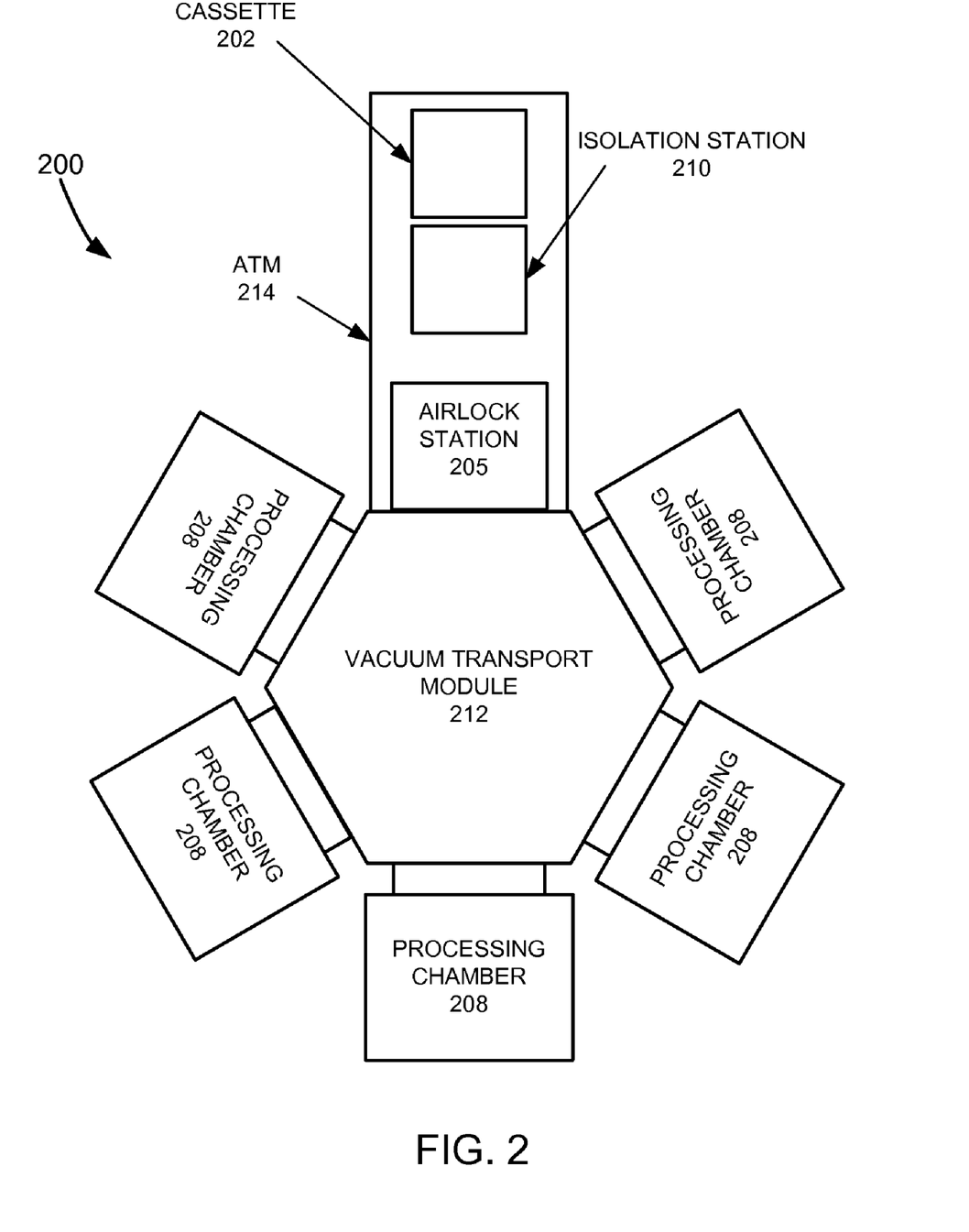
FIG. 2 is a schematic view of a system including an embodiment of the invention

FIG. 2 is a top view of a processing tool 200 and includes components of an embodiment of the invention. A cassette 202 houses the unprocessed wafers before they are processed and then holds the treated wafers once all processing in the processing tool 200 and treating in a degas chamber is completed. The cassette 202 can hold many wafers, often as many as 25. An airlock station 205 represents a set of devices that operate to transfer the wafer back and forth between the atmosphere of an atmosphere transport module (ATM) 214 and the vacuum of a vacuum transport module (VTM) 212. The VTM 212 is part of the processing tool and connects to a plurality of processing chambers 208. There may be different types of processing chambers 208. For example, there may be different processing chambers 208 for each of the following: applying an etch mask, etching, or stripping an etch mask. Alternatively, there may be two or more of the same type of processing chamber 208, in order to help increase throughput.

Figure 3:
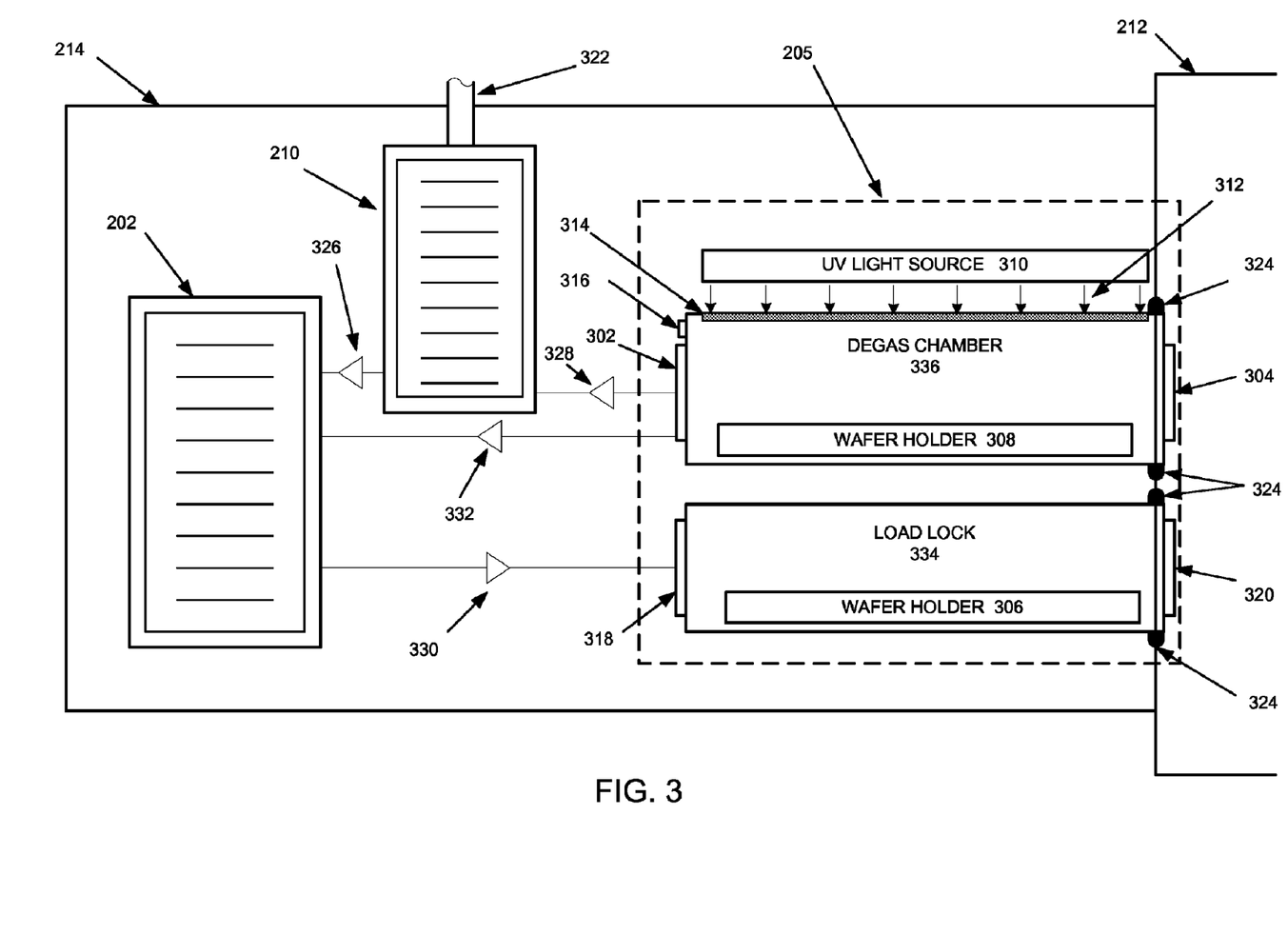
FIG. 3 is a schematic view of an atmosphere transport module with an isolation station and cassette.

FIG. 3 shows a side view of the ATM 214 together with an isolation station 210 and the cassette 202. The airlock station 205 is shown in more detail including the degas chamber 336 and the entrance load lock 334. The entrance load lock 334 has a door to atmosphere 318, a door to vacuum 320, a wafer holder 306, a vent (not shown) and an evacuation means (not shown). The degas chamber 336 and the entrance load lock 334 must be attached to the VTM 212 in a manner that maintains the vacuum in the VTM 212. Therefore, there are vacuum seals 324 at the points where VTM 212 meets the degas chamber 336 and load lock 334 in order to prevent atmosphere from seeping into the VTM 212. While FIG. 3 shows the entrance load lock 334 and the degas chamber 336 as separate structures, it is possible that they may be separate pieces joined together or be machined as one piece. An isolation station 210 holds a plurality of treated wafers to allow any remaining residue to dissipate. The isolation station 210 is preferably made of non-corrosive material to lessen any damage done by any equipment contamination. The isolation station 210 has an exhaust 322 that helps to pull any remaining residue away from the wafers by pumping air out of the isolation station 210.

Figure 4:
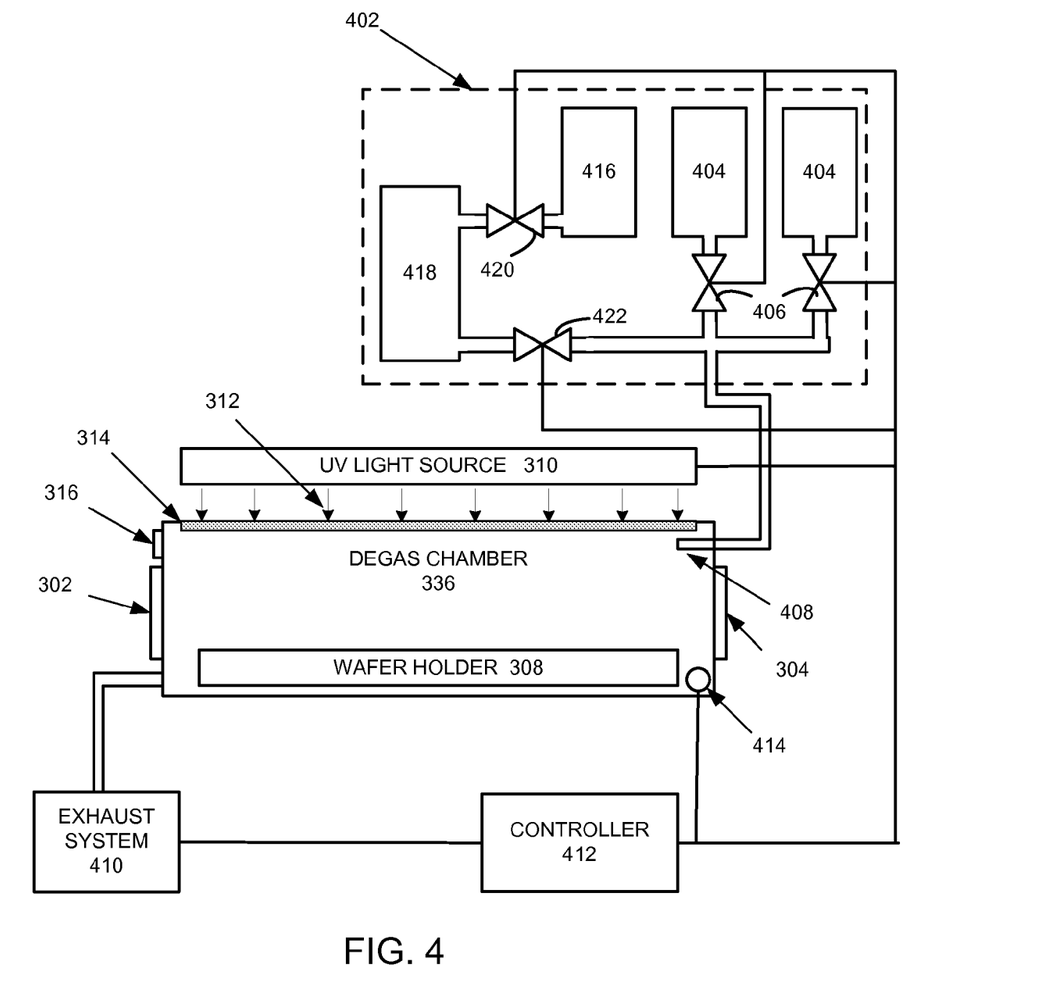
FIG. 4 is a schematic view of an embodiment of a degas chamber and related components.

FIG. 4 shows a more detailed exemplary degas chamber together with related components. The degas chamber 336 may be made of non-corrosive material, for example it may be anodized. The degas chamber 336 includes a door to atmosphere 302, a door to vacuum 304, a wafer holder 308, a UV light source 310, an exhaust system 410, a pressure sensor 414, a vent 316, and a gas injector 408.

Figure 6:
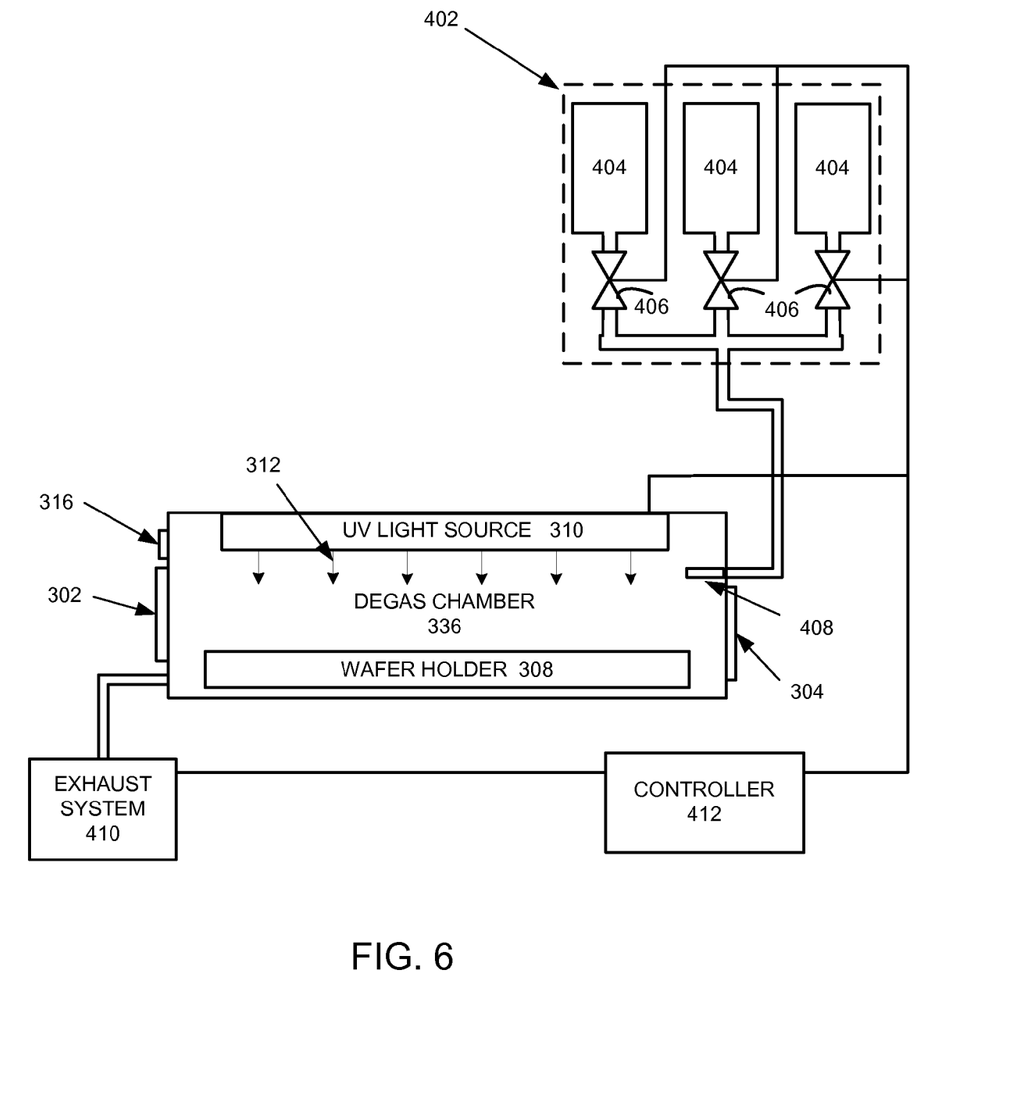
FIG. 6 is a schematic view of another embodiment of a degas chamber and related components.

FIGS. 3 and 4 show the UV light source 310 located outside the degas chamber 336. In this embodiment, the degas chamber 336 includes a window 314 through which the UV light 312 from the UV light source 310 shines onto the processed wafer held below in the wafer holder 308. An alternative embodiment is shown in FIG. 6 where the UV light source 310 is located inside the degas chamber 336. Regardless of its location inside or outside the degas chamber 336, the UV light source 310 is preferably located no more than about 30 cm from the wafer being treated. More preferably, the UV light source 310 is located as close as possible to the wafer being treated.

The gas injector 408 injects gas into the degas chamber 336. The gas is provided by the gas source 402. An exemplary gas source 402 may include a number of individual gas tanks 404 for holding the different gases provided, an oxygen tank 416, and an ozone generator 418. The gas source 402 also includes a control valve 406 for each of the individual gas tanks 404. There is also an oxygen control valve 420 and an ozone control valve 422. While FIG. 4 shows two individual gas tanks 404 and the oxygen tank 416, there may be a different number of gas tanks 404, as required for holding the different number of individual gases. For example, the injected gas may contain a mixture of ozone and oxygen and therefore there would be at least the oxygen tank 416 for holding oxygen and the ozone generator 418 for converting a portion of the oxygen to ozone. However, if the gas also contained nitrogen, for example, there would be a gas tank 404 for holding the nitrogen.

An alternative embodiment of a gas source 402 is shown in FIG. 6. In this embodiment, there is no ozone generator 418. When there is no ozone generator 418, the ozone may be generated within the degas chamber by the application of specific UV light 312 from the UV light source 310. Typically, a wavelength of less than 200 nm may be used to generate ozone from oxygen. While FIG. 4 shows one embodiment of the gas source 402 together with one embodiment of the degas chamber 336 and FIG. 6 shows a different embodiment of the gas source 402 together with a different embodiment of the degas chamber 336, these parts may be interchanged. Thus the gas source 402 of FIG. 4 may be used with the degas chamber 336 of FIG. 6, and the gas source 402 of FIG. 6 may be used with the degas chamber 336 of FIG. 4.

An example of a suitable gas injector 408 is a five-finger injector which has five individual injector nozzles spread out and aimed apart from one another in order to aim the injected gas to have an evenly spread flow. The gas injector 408 and the exhaust system 410 need to be located in a manner that allows the gas to come in the gas injector 408, flow over the wafer and then be pulled out of the degas chamber 336 by the exhaust system 410. For example, the embodiment shown in FIG. 4 shows the gas injector 408 at the top of one side of the degas chamber 336 and the exhaust system 410 located at the bottom of the opposite side. A suitable exhaust system 410 may include ducting and a dedicated air pump, for example. In another embodiment, the exhaust system 410 may just comprise ducting, which leads to a non-dedicated air pump.

A controller 412 is shown connected to the pressure sensor 414, the exhaust system 410, the UV light source 310, the control valves 406, the oxygen control valve 420 and the ozone control valve 422. However the controller may also be connected to and control other components, for example the vent 316, the door to atmosphere 302 and the door to vacuum 304.

Figure 5A:
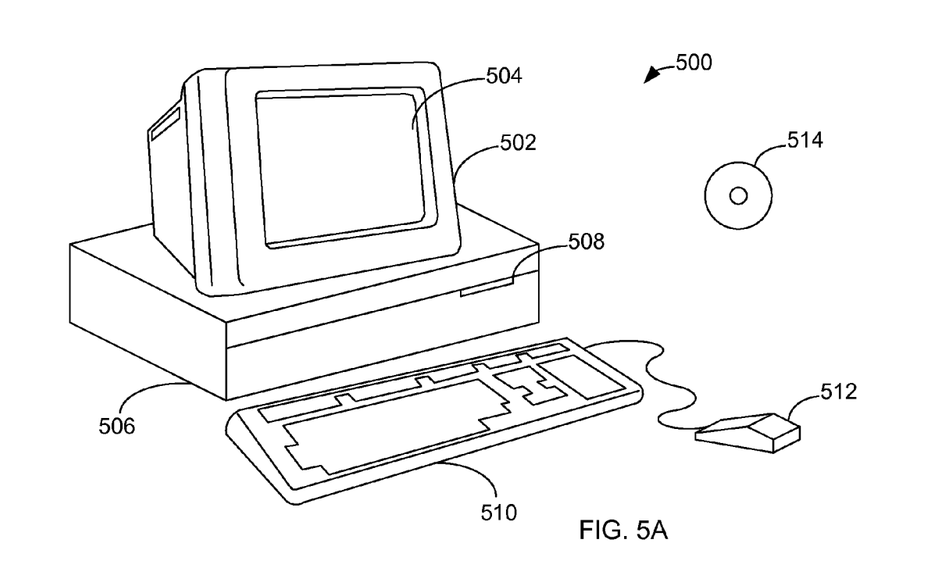
FIGS. 5A-B are schematic views of a computer system that may be used in practicing the invention.
Figure 5B:
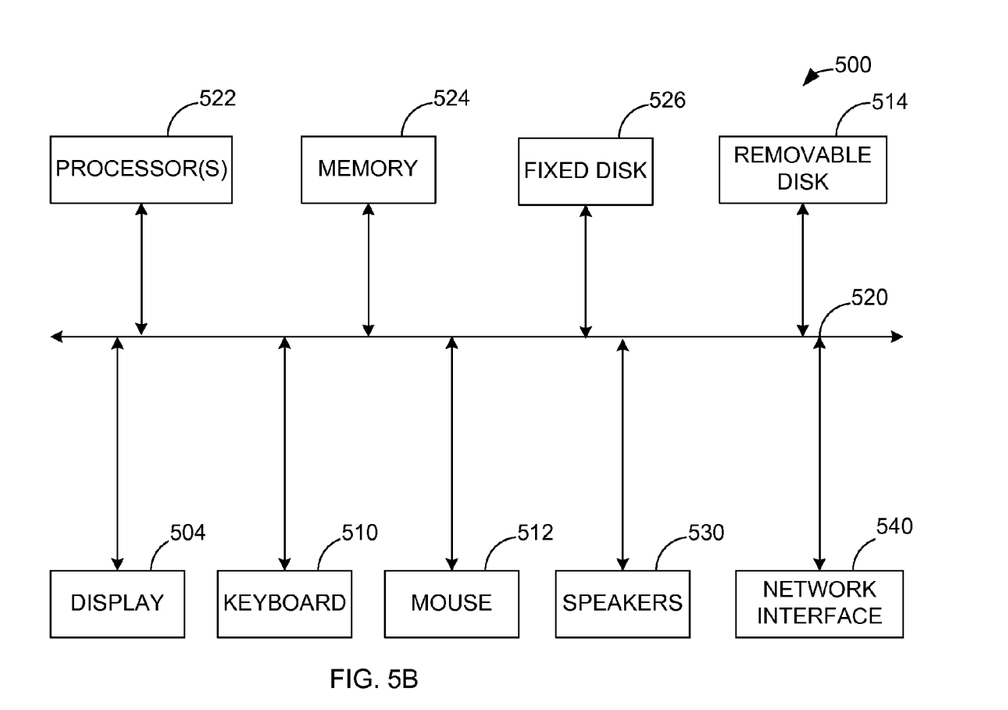

FIGS. 5A and 5B illustrate a computer system 500, which is suitable for implementing a controller 412 used in embodiments of the present invention. FIG. 5A shows one possible physical form of the computer system. Of course, the computer system may have many physical forms ranging from an integrated circuit, a printed circuit board, and a small handheld device up to a huge super computer. Computer system 500 includes a monitor 502, a display 504, a housing 506, a disk drive 508, a keyboard 510, and a mouse 512. Disk 514 is a computer-readable medium used to transfer data to and from computer system 500.

FIG. 5B is an example of a block diagram for the computer system 500. Attached to system bus 520 is a wide variety of subsystems. Processor(s) 522 (also referred to as central processing units or CPUs) are coupled to storage devices, including memory 524. Memory 524 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 526 is also coupled bi-directionally to CPU 522; it provides additional data storage capacity and may also include any of the computer-readable media described below. Fixed disk 526 may be used to store programs, data, and the like and is typically a secondary storage medium (such as a hard disk) that is slower than primary storage. It will be appreciated that the information retained within fixed disk 526 may, in appropriate cases, be incorporated in standard fashion as virtual memory in memory 524. Removable disk 514 may take the form of any of the computer-readable media described below.

CPU 522 is also coupled to a variety of input/output devices, such as display 504, keyboard 510, mouse 512 and speakers 530. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 522 optionally may be coupled to another computer or telecommunications network using network interface 540. With such a network interface, it is contemplated that the CPU might receive information from the network, or might output information to the network in the course of performing the above-described method steps. Furthermore, method embodiments of the present invention may execute solely upon CPU 522 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

In a more detailed embodiment of the invention, the unprocessed wafer typically starts in a cassette 202. An unprocessed wafer is removed from the cassette 202 (step 102) and transferred to the entrance load lock 334 through the door to atmosphere 318 (step 104). This is shown by a first workflow indicator 330 in FIG. 3. When the procedure starts, the door to vacuum 320 is closed and the door to atmosphere 318 is open. The wafer is then held in the wafer holder 306 and the door to atmosphere 318 is closed and sealed. The evacuation means evacuates the atmosphere in the sealed entrance load lock 334, thus forming a vacuum (step 108). The door to vacuum 320 is now opened and the wafer is transferred out of the entrance load lock 334 and through the VTM 212 into a processing chamber 208 in the processing tool 200 (step 112). In the processing chamber 208, the wafer is processed (step 116). For example, the processing may include the wafer having an etch mask applied, being etched, or having an etch mask stripped. Multiple processing chambers 208 may be used and a single wafer may undergo one or more processes that may require the use of one or more processing chambers.

After processing, the processed wafer is removed from the processing chamber 208 and transferred through the VTM 212 to the degas chamber 336 (step 120). In order to receive a processed wafer from the VTM 212, there must be a vacuum in the degas chamber 336. Therefore, before the degas chamber 336 receives the wafer both doors 302, 304 of the degas chamber must be sealed and then the atmosphere in the degas chamber 336 is evacuated by the exhaust system 410. Once the pressure sensor 414 detects a vacuum in the degas chamber 336, the door to vacuum 304 is opened and the degas chamber 336 is ready to receive a processed wafer. At this point the door to atmosphere 302 of the degas chamber 336 is still sealed and the door to vacuum 304 is open and the wafer is transferred through the open door to vacuum 304 and into the degas chamber 336 (step 120). Once in the degas chamber 336, the wafer is held by the wafer holder 308 and the door to vacuum 304 is closed and sealed. The wafer is now ready to be treated in the degas chamber 336.

The UV light 312 is turned on and the gas injector 408 injects gas into the degas chamber 336 to treat the processed wafer (step 124). In one embodiment, the injected gas contains at least one of ozone or oxygen. The gas may also contain other components such as nitrogen and/or water vapor. An exemplary mixture of the gas is composed of 15 wt. % ozone and 85 wt. % oxygen. The gas preferably contains from approximately 3 wt. % ozone to approximately 30 wt. % ozone. More preferably, the gas contains approximately 5 wt. % ozone to approximately 20 wt. % ozone. The composition of the gas mixture may be set by controlling the control valves 406, oxygen control valve 420 and ozone control valve 422 to allow different flow rates of the required gases. The gas is flowed over the wafer and then out the exhaust system 410.

The wafer is treated with the UV light 312 and gas in the degas chamber 336 for a period of time that allows the halogen residue to be substantially removed from the wafer. Preferably the treatment lasts between 5 seconds and 20 minutes. More preferably the treatment lasts between 10 seconds and 120 seconds. Once the treatment is completed, the gas flow is stopped (step 128). The exhaust system 410 may be left running for a short time to allow the remaining gas to be removed from the degas chamber 336 before the degas chamber 336 is vented. The degas chamber 336 is vented to atmospheric pressure by way of the vent 316 (step 132) and the UV light 312 is stopped (step 136). The pressure sensor 414 coupled with the degas chamber 336 may be used to ensure that the pressure inside the degas chamber 336 matches the pressure outside the degas chamber 336 before the door to atmosphere 302 is opened.

The door to atmosphere 302 is opened and the wafer is removed from the degas chamber 336 through the door to atmosphere 302 (step 140). The wafer may then be moved to an isolation station 210 as shown by a second workflow indicator 328 (step 144). The isolation station 210 may hold the treated wafer for a period of time to allow any remaining residue to dissipate. Preferably, the treated wafer is held in the isolation station for 1 minute to 30 minutes. If the isolation station 210 has an exhaust 322, it may be turned on to help to pull any remaining residue away from the wafers by pumping air from the isolation station 210. Once the wafer is done in the isolation station 210, it is moved back to the cassette 202 as shown by a third workflow indicator 326 (step 148). Alternatively, the wafer may be transferred directly from the degas chamber 336 to the cassette 202 without the need for an isolation station 210 as shown by a fourth workflow indicator 332.

Specifically, an exemplary degas load lock station includes: a degas chamber, a wafer holder, a pressure sensor, a UV light source, a gas injector, an exhaust system, a vent, vacuum seals and an isolation station.

The addition of a degas load lock station helps to solve the problems created by the contaminating residue, while also avoiding the deficiencies inherent in the microwave stripper. By adding a degas load lock station that does not take a valuable spot in the processing tool, the processing tool is capable of hosting another processing chamber and thus increasing the overall throughput of the processing tool while also helping to remove the contaminating residue. Additionally, the degas load lock station and the method of using it do not require the high temperatures needed in the microwave stripper. With the addition of the degas load lock station, the unprocessed wafers entering the processing tool 200 and the processed wafers exiting the processing tool 200 can travel different paths. The incoming unprocessed wafer travels through the entrance load lock 334 and the outgoing processed wafer travels through the degas chamber 336. Therefore, the processed wafer having the contaminating residue does not come in close proximity with an unprocessed wafer, for example in a single two-way airlock that would transfer both incoming and outgoing wafers. Additionally, the processed wafers cannot contaminate the entrance load lock 334 itself since they do not travel through the entrance load lock 334. This helps to prevent cross contamination between the processed wafers and the unprocessed wafers.

While this invention has been described in terms of several preferred embodiments, there are alterations, permutations, modifications and various substitute equivalents, which fall within the scope of this invention. It should also be noted that there are many alternative ways of implementing the methods and apparatuses of the present invention. It is therefore intended that the following appended claims be interpreted as including all such alterations, permutations, modifications, and various substitute equivalents as fall within the true spirit and scope of the present invention.

What is claimed is:

1. A degas station for removing halogen species from a wafer that have accumulated during processing of the wafer, said degas station comprising:
   a degas chamber capable of creating and maintaining a vacuum and capable of housing the wafer;
   a wafer holder, for holding the wafer in the degas chamber;
   a UV light source, for treating the wafer with UV light while the wafer is in the degas chamber;
   an injector, coupled with the degas chamber, for injecting a gas comprising at least one of oxygen or ozone into the degas chamber such that the gas flows over the wafer housed in the degas chamber;
   an exhaust system, coupled with the degas chamber, wherein the exhaust system is capable of evacuating the degas chamber to create a vacuum and wherein the exhaust system is capable of removing the gas in a manner that substantially maintains the vacuum in the degas chamber while the gas is injected into the degas chamber;
a first wafer opening, in the degas chamber, for receiving the wafer from a load-locked vacuum chamber; and
a plurality of vacuum seals, surrounding the first wafer opening such that the degas chamber is coupled with the vacuum chamber at the first wafer opening.

2. The degas load lock station recited in claim 1, wherein the UV light source is disposed outside of the degas chamber and wherein at least one side of the degas chamber is such that the UV light from the UV light source passes through a window into the degas chamber onto the wafer.

3. The degas load lock station recited in claim 1, wherein the UV light source is disposed inside the degas chamber.

4. The degas load lock station recited in claim 1, further comprising:
an isolation station, wherein the isolation station holds a plurality of wafers that have been degassed in the degas chamber.

5. The degas load lock station recited in claim 4, wherein the isolation station includes an exhaust that pumps air out of the isolation station.

6. The degas load lock station recited in claim 1, wherein the UV light source is less than 30 cm from the wafer holder.

7. The degas load lock station recited in claim 1, wherein the gas comprises ozone.

8. The degas load lock station recited in claim 1, wherein the gas comprises oxygen and the UV light provided by the UV light source is such that ozone is generated in the degas chamber by application of the UV light to the gas comprising oxygen.

9. A method comprising:
providing a wafer into an entrance load lock chamber;
creating a vacuum in the entrance load lock chamber;
transporting the wafer from the entrance load lock chamber to a processing tool;
processing the wafer to provide a processed wafer, wherein the processing forms halogen residue on the wafer;
transferring the processed wafer into a degas chamber through a first opening in the degas chamber, wherein a vacuum is maintained in the degas chamber;
treating the processed wafer in the degas chamber with UV light and a flow of gas comprising at least one of ozone or oxygen;
stopping the flow of gas;
venting the degas chamber to atmospheric pressure such that the vacuum is removed; and
removing the processed wafer from the degas chamber, through a second opening in the degas chamber.

10. The method of claim 9 further comprising:
transferring the processed wafer to an isolation station after removal from the degas chamber, wherein the isolation station holds a plurality of processed wafers.

11. The method of claim 9, further comprising pumping out the flow of gas comprising at least one of ozone or oxygen.

12. The method of claim 9, wherein the gas further comprises one or more of: nitrogen gas or water vapor.

13. The method of claim 10, wherein the providing a wafer to the entrance load lock chamber provides the wafer from a cassette, and further comprising transferring the processed wafer from the isolation station to the cassette.

14. The method of 13, wherein the processed wafer is treated in the degas chamber for between 5 seconds and 30 minutes.

15. The method of claim 9, wherein the flow of gas comprises ozone.

16. The method of claim 9, wherein the gas comprises oxygen and wherein the UV light provided by the UV light source is such that ozone is generated in the degas chamber by application of the UV light to the gas comprising oxygen.

17. A system for processing a wafer used to produce semiconductor devices, said system comprising:
an entrance load lock;
a degas station; said degas station comprising:
a degas chamber capable of creating and maintaining a vacuum and capable of housing the wafer;
a wafer holder, for holding the wafer in the degas chamber;
a UV light source, for treating the wafer with UV light while the wafer is in the degas chamber;
an injector, coupled with the degas chamber, for injecting a gas comprising at least one of oxygen or ozone into the degas chamber such that the gas flows over the wafer housed in the degas chamber;
an exhaust system, coupled with the degas chamber, wherein the exhaust system is capable of evacuating the degas chamber to create a vacuum and wherein the exhaust system is capable of removing the gas in a manner that substantially maintains the vacuum in the degas chamber while the gas is injected into the degas chamber;
a first wafer opening, in the degas chamber; and
a plurality of vacuum seals surrounding the first wafer opening;
a processing tool comprising:
a vacuum transport module coupled with the entrance load lock and coupled with the degas chamber at the first wafer opening; and
a plurality of processing chambers, coupled with the vacuum transport module, for processing the wafer;
wherein the plurality of vacuum seals surround the first wafer opening such that the degas chamber is coupled with the vacuum transport module and the plurality of vacuum seals maintain a vacuum seal between the degas chamber and the vacuum transport module.

18. The system recited in claim 17, wherein the degas station further comprises:
an isolation station, wherein the isolation station holds a plurality of wafers that have been degassed in the degas chamber.

19. The system recited in claim 17, wherein the plurality of processing chambers comprises at least one processing chamber configured to perform at least one of: applying an etch mask, etching or stripping an etch mask.

20. The degas station, as recited in claim 1, further comprising:
a pressure sensor coupled with the degas chamber, for sensing pressure in the degas chamber;
an atmospheric vent capable of venting the degas chamber to atmospheric pressure to provide for wafer transfer to atmosphere; and
a second wafer opening in the degas chamber, for transferring the wafer out of the degas chamber to an ambient atmosphere environment, wherein the degas station acts as both a degas and load lock station in a single chamber.

* * * * *